United States Patent [19]

Engeler

[11] 4,240,089
[45] Dec. 16, 1980

[54] LINEARIZED CHARGE TRANSFER DEVICES

[75] Inventor: William E. Engeler, Scotia, N.Y.

[73] Assignee: General Electric Company, Schenectady, N.Y.

[21] Appl. No.: 952,413

[22] Filed: Oct. 18, 1978

Related U.S. Application Data

[63] Continuation of Ser. No. 591,637, Jun. 30, 1975, abandoned.

[51] Int. Cl.³ .................. H01L 29/78; G11C 19/28
[52] U.S. Cl. .................. 357/24; 307/221 D; 357/89
[58] Field of Search ............ 357/24; 307/221 D

[56] References Cited

U.S. PATENT DOCUMENTS

| | | | |
|---|---|---|---|
| 3,623,132 | 11/1971 | Green | 357/24 |
| 3,660,697 | 5/1972 | Berglund et al. | 357/24 |
| 3,693,055 | 9/1972 | Beneking | 357/22 |
| 3,801,883 | 4/1974 | Tiemann | 357/24 |
| 3,858,232 | 12/1974 | Boyle et al. | 357/24 |
| 3,969,636 | 7/1976 | Baertsch et al. | 307/221 D |
| 4,032,948 | 6/1977 | Engeler et al. | 357/24 |
| 4,047,216 | 9/1977 | French | 357/24 |
| 4,110,777 | 8/1978 | Esser et al. | 357/24 |

Primary Examiner—Gene M. Munson
Attorney, Agent, or Firm—Julius J. Zaskalicky; James C. Davis, Jr.; Marvin Snyder

[57] ABSTRACT

In surface charge transfer devices a surface adjacent semiconductor layer of high resistivity and an underlying semiconductor layer of substantially lower resistivity are provided. The devices are operated to maintain depletion in the surface adjacent layer at least to the interface between the two layers to maintain substantially constant depletion depth and thereby provide substantially linear response.

1 Claim, 6 Drawing Figures

LINEARIZED CHARGE TRANSFER DEVICES

This application is a continuation of our patent application Ser. No. 591,637, filed June 30, 1975, how abandoned.

The present invention relates in general to CIS (Conductor-Insulator-Semiconductor) capacitance devices and in particular to arrays of such capacitance devices referred to as surface charge transfer devices organized to function as correlators, transversal filters and the like.

A surface charge correlator such as described and claimed in U.S. Pat. No. 3,801,883 assigned to the assignee of the present invention, includes a plurality of surface charge capacitors the electrodes of which are interconnected. To provide an output which is a linear function of the input to the surface charge capacitors the requirement must be met that each selected signal sample represented by a respective packet of surface charge cause an induced voltage change on its respective sensing electrode which is independent of the potential of the respective sensing electrode. Similarly, in a surface charge transversal filter such as disclosed in patent application Ser. No. 527,658, filed Nov. 27, 1974 and also assigned to the assignee of the present invention, there is included a plurality of capacitance storage devices in which the electrodes are interconnected. The electrodes are charged to a voltage and packets of charge representing signal samples are transferred into the storage devices and produce changes in the surface potential of the devices. As in the case of the storage devices using the usual structure in the correlator mentioned above, the surface depletion capacitance is a function of the surface potential and accordingly the voltage change on each of the storage devices is not independent of the surface potential.

In a CIS capacitance device the capacitance of the device upon being charged by a depletion producing voltage applied across the electrodes thereof is constituted of a fixed dielectric capacitance in series with a depletion capacitance. The depletion capacitance is a function of semiconductor surface potential. Accordingly, as charge is introduced into the depletion region and becomes situated at the oxide-semiconductor interface, the depletion capacitance changes. Thus, change in signal on the electrode overlying the insulator, either in the form of a voltage change, if the electrode is allowed to float, or in a flow of a quantity of charge to the electrode if the electrode voltage is held fixed, is not a linear function of the charge introduced into the storage region. This non-linearity in the operation of a CIS capacitor when incorporated in devices such as correlators and in transversal filters, and also when used as an individual sensing element for sensing charges results in errors and in inaccuracies in the output of the devices.

The present invention is directed to overcoming such errors and inaccuracies in CIS capacitance devices and in apparatus incorporating such devices.

A principal object of the present invention is to provide improved linearity of response of apparatus such as correlators, transversal filters and the like utilizing charge transfer devices.

In carrying out the invention in an illustrative embodiment there is provided a substrate of one conductivity type semiconductor material having a first layer and a second layer. The first layer is of substantially uniform thickness and overlies the second layer. The resistivity of the first layer is substantially greater than the resistivity of the second layer. An insulator is provided overlying the first layer. A conductor member is provided overlying the insulator member. Means are provided for applying a voltage between the conductor member and the second layer to deplete entirely of majority carriers the portion of the first layer underlying the conductor member and to deplete at least a portion of the second layer underlying the conductor member. Means are also provided for introducing charge in the form of minority carriers into the first portion of the first layer corresponding to a signal to cause the surface potential thereof to decrease in absolute magnitude while still maintaining depletion in at least a portion of the second layer. Means are further provided for sensing the signal on the conductor member.

The novel features which are believed to be characteristic of the present invention are set forth with particularity in the appended claims.

The invention itself, both as to its organization and method of operation, together with further objects and advantages thereof may best be understood by reference to the following description taken in connection with the accompanying drawings wherein FIG. 1 is a sectional view of a single capacitance device showing the construction thereof and connected to an electrode charging and sensing circuit.

FIG. 2 is the equivalent circuit of the device of FIG. 1.

FIG. 3 shows a pair of graphs of potentials in the semiconductor capacitance device of FIG. 1 as a function of distance normal to the surface of the semiconductor body underlying the first electrode thereof, each graph representing the variation of potential from a maximum at the surface to a minimum at the maximum depletion depth for respective surface potentials at the surface corresponding to particular potentials and charge densities thereat.

Figure 1:
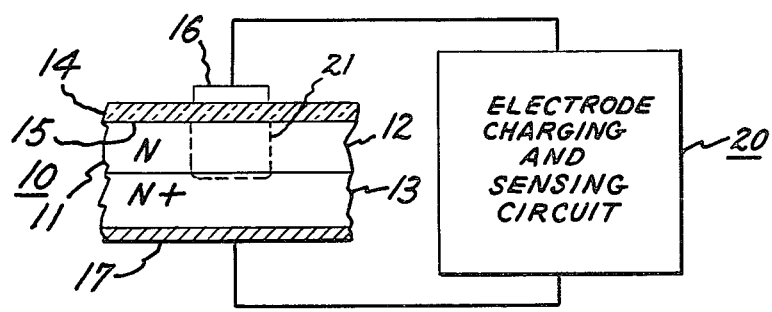

Reference is now made to FIG. 1 which shows a semiconductor capacitance device 10 in accordance with one embodiment of the present invention. The device 10 comprises a body 11 of semiconductor material of one conductivity type such as N-type silicon, for example, including a first layer 12 of high resistivity epitaxially deposited silicon and a second layer 13 of low resistivity silicon. The layers 12 and 13 are designated N and N+, respectively. Conveniently, the first layer has a resistivity of 5 ohm centimeters representing a net donor activator concentration of $10^{15}$ activators per cubic centimeter and is 3 microns thick. The second layer has a resistivity of 0.01 ohm centimeters corresponding to a net donor activator concentration of about $10^{19}$ activators per cubic centimeter. A thin layer 14 of a suitable insulating material such as silicon dioxide, for example, 1000 Å thick is provided on the major exposed face 15 of the first layer. A conductive film or plate 16 of a suitable conductive material, such as doped polycrystalline silicon, aluminum or molybdenum, for example, is formed on the insulating layer 14 overlying a portion of the major surface of the layer and constitutes a first electrode of the device. Another film or plate 17 of conductive material is secured to and in ohmic contact with the other major face of the substrate and constitutes the second electrode of the device. Also shown in this figure is a electrode charging and sensing circuit 20 to which the electrodes 16 and 17 of the capacitance device 10 are connected. The electrode charging and sensing circuit 20 may consist of a source of unidirectional potential which biases the electrode 16 with respect to the base electrode 17 to a negative voltage to form depletion region 21. Thereafter the electrode is allowed to float. After charge has been introduced into the depletion region 21, the sensing circuit is connected across the electrodes to sense the change in voltage thereon and obtain a measure of the charge introduced into the depletion region. When a voltage of −20 volts is applied to the electrode 16 with respect to the electrode 17 for a device having the dimensions and resistivities specified above, the depletion region 21 produced extends entirely through the first layer 12 and into a portion of the second layer 13 as depicted. The electrode charging and sensing circuit may also comprise the charging and sensing circuit utilized in the transversal filter of FIG. 3 of the aforementioned patent application Ser. No. 527,658 for charging the electrodes 46, 48 and 50 thereon and thereafter measuring the change in voltage thereon in response to the introduction of charge into the storage regions underlying the electrodes 46, 48 and 50 from adjacent storage regions. The electrodes charging and sensing circuit may also be a circuit such as disclosed in connection with the correlator of FIG. 4 in the aforementioned U.S. Pat. No. 3,801,883 for charging the sensing lines $\phi_1(A)$ and $\phi_1(B)$ and for sensing the voltage changes thereon. The electrode charging and sensing circuit may also be a circuit such as disclosed in U.S. Pat. No. 3,969,636 assigned to the assignee of the present invention, for providing a constant voltage to the storage electrodes and measuring the charge flow into the electrodes in response to the introduction of charge into the depletion or charge storage region of the device while maintaining the voltage on the storage electrodes fixed. The aforementioned patent and patent applications are incorporated hereto by reference thereto.

Figure 2:
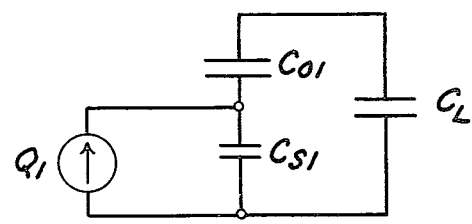

Reference is now made to FIG. 2 which shows the small signal equivalent circuit of the capacitance device 10 of FIG. 1. The capacitance of the device of FIG. 1 comprises an oxide capacitance designated $C_{O1}$ and a depletion of substrate capacitance designated $C_{S1}$ connected in series with the oxide capacitance between the electrodes of the capacitance device. A source of charge Q1 is shown connected in parallel with the semiconductor capacitance $C_{S1}$ and represents a source of charge for introducing charge into the depletion region by various means, for example, by means of adjacent storage regions holding charge and coupled thereinto. Capacity $C_L$ represents the load capacitance of the sensing circuit and includes other capacitances between the electrode 16 and other electrodes on the substrate as well as the substrate.

Figure 3:
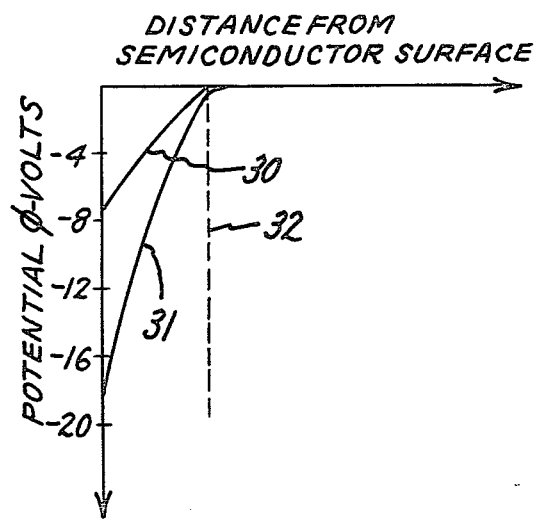

Reference is now made to FIG. 3 which shows a pair of graphs 30 and 31, each representing the distribution of potential in the semiconductor substrate of the conductor-insulator-semiconductor capacitor of FIG. 1 from one extreme value at the oxide-semiconductor interface or surface 15 to another extreme value at the maximum depletion depth for a given depletion producing voltage applied between the electrodes 16 and 17 of the device 10. Graph 30 shows the depletion which is produced when a voltage of approximately −9 volts is applied to electrode 16 with respect to electrode 17, with the resistivity of the first layer of 5 ohm centimeters (a net activator concentration of $10^{15}$ net activators per cubic centimeter) and a thickness of 3 microns. The exact value of voltage applied to electrode 16 necessary to deplete through the first layer depends on the specific electrode material used and fixed charge as is well known. For this applied voltage the depletion of majority carriers extends to the interface between the first and the second layers represented by the dotted line 32. Graph 31 shows the distribution of potential in the substrate when approximately −20 volts is applied to electrode 16 with respect to electrode 17. In view of the fact that the second layer 13 is much more heavily doped ($10^{19}$ net activator per cubic centimeter, for example) the depletion does not extend very far into this layer. The depletion penetration into the second layer 13 is exaggerated for reasons of clarity. In both cases the CIS storage and transfer cell is shown empty of minority carriers. When minority carriers are introduced into the storage region, a change in the potential distribution occurs. The potential $\phi_s$ at the surface of the semiconductor will change but the shape of the potential distribution below the surface will be substantially the same since the stored charge is confined to the surface region. For the reasons given above the total depletion depth of the semiconductor will not be altered, provided that the surface potential $\phi_s$ does not fall below the value which just depletes the first layer. Thus, as depletion distance changes only slightly when a surface potential of about −7 volts is reached corresponding to a volage of about −9 volts applied to the electrode 16 in the case of the empty storage region, the depletion capacitance remains substantial constant for surface potentials beyond about −7 volts and is substantially independent of both the quantity of stored charge and the voltage applied to electrode 16. Preferably, the first layer has a resistivity at least ten times as great as the resistivity of the second layer. With higher resistivities the depletion capacitance would be more nearly constant with voltages in the indicated range. Accordingly, in the apparatus of FIG. 1 with both depletion capacitance and oxide capacitance of the device 10 fixed in value a linear response is provided at the output in response to the introduction of charge into the depletion region of device 10.

Figure 4:
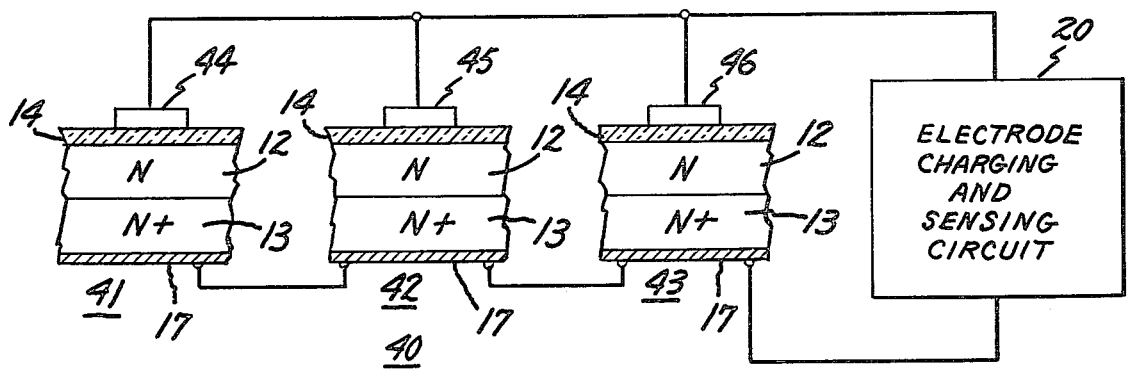
FIG. 4 shows a sectional view of a plurality of capacitance cevices such as shown in FIG. 1 connected in parallel and connected to an electrode charging and sensing circuit.

Reference is now made to FIG. 4 which shows an array 40 including capacitance devices 41, 42 and 43, such as shown in FIG. 1, formed on a common substrate. Conveniently the devices are shown separated to indicate that intervening structure may be included therebetween for the transfer of charge from one device to the other. Each of the devices of FIG. 4 is identical in structure to the device of FIG. 1 and the corresponding elements thereof are identically designated except for the overlying conductors or electrodes 44, 45 and 46. The conductors 44, 45 and 46 are connected in parallel and connected to a electrode charging and sensing circuit. The substrate electrode 17 is also connected to the circuit 20. The array 40 may represent a portion of the surface charge transversal filter of FIG. 3 of the aforementioned patent application Ser. No. 527,658 and the electrodes 42, 43 and 44 may correspond to electrodes 46, 48 and 50 of the surface transversal filter of FIG. 3 of that patent application. Electrode charging and sensing circuit may comprise the charging and sensing circuit shown and described in connection with the transversal filter of FIG. 3 of that patent application. The semiconductor device structure of FIG. 4 may also represent a portion of the correlator structure of FIG. 4 of U.S. Pat. No. 3,801,883 and in particular the storage capacitors connected to either the $\phi_1(A)$ line or the $\phi_1(B)$ line thereof.

Figure 5:
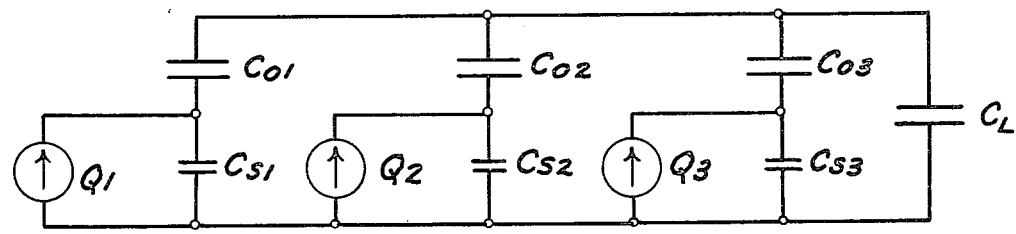
FIG. 5 is an equivalent circuit of the apparatus shown in FIG. 4.

Reference is made to FIG. 5 which shows the equivalent circuit of the device of FIG. 4 in which capacitances $C_{O1}$, $C_{O2}$ and $C_{O3}$ represent the dielectric or oxide capacitances of the devices 41, 42 and 43, respectively. The capacitances $C_{S1}$, $C_{S2}$ and $C_{S3}$ represent the semiconductor or depletion capacitances of the devices 41, 42 and 43, respectively. The capacitance $C_L$ represents the capacitance of the output circuit of the array of devices 40, as well as capacitances of the electrodes 44, 45 and 46 with respect to the substrate. The charge sources $Q_1$, $Q_2$ and $Q_3$ may represent the storage regions from which charge is introduced into the storage regions underlying the conductors 44, 45 and 46, respectively. For example, the source $Q_1$ may comprise the storage region underlying electrode 40 of FIG. 3 of the aforementioned patent application Ser. No. 527,658. Charge source $Q_2$ may represent the storage region underlying electrode 60 and also the source $Q_3$ may represent the charge storage region underlying the electrode 61.

With respect to FIG. 4, a common output for the sensing and summing of charge by the electrode charging and sensing circuit 20 is provided. This output connection may be maintained at a fixed potential or it may be allowed to vary with the introduction of the surface charge into some of the storage regions. By maintaining a fixed value of depletion capacity at each of the storage sites independent of the applied voltage, as explained above, an output response of each cell or storage region is independent of the charges introduced into the other cells or storage regions. Thus, a linear superposition of the output responses of each cell is possible.

Figure 6:
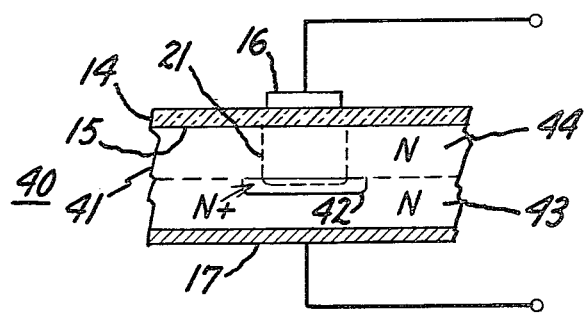
FIG. 6 shows another embodiment of the invention.

Referring now to FIG. 6, there is shown another embodiment of the present invention. Elements of the device of FIG. 6 which are identical to the elements of the device of FIG. 1 are identically designated. The device 40 comprises a body 41 of N type conductivity in which a buried layer 42 of N+ conductivity corresponding to the high conductivity second layer of FIG. 1 is provided. The body 41 with the buried layer 42 therein may be formed by initially starting with a wafer of semiconductor material 43 of N-type conductivity and the desired resistivity, for example 5 ohm centimeters, and forming therein by diffusion the buried layer 42, for example, by diffusing a heavy concentration of antimony activators into a restricted surface region to provide a resistivity substantially lower than the resistivity of region 43. Thereafter an additional layer 44 of N-type conductivity having a resistivity about the same as the resistivity of layer 43 is epitaxially grown thereon to the thickness desired to provide the desired thickness between the oxide-semiconductor interface and the adjacent surface of the buried layer 42. With a net activator concentration of $10^{15}$ net activators per cubic centimeter in the layer 44, corresponding to a resistivity of about 5 ohm centimeters, and a depth of 3 microns, a surface potential at the interface underlying the electrode 16 of approximately 7 volts would just deplete the layer 44 to the buried layer 42. At voltages beyond $-7$ volts, the depletion region would extend into the buried layer 42 and assuming a heavy concentration of net activators, for example, of two orders of magnitude (a factor of 100) greater than the net activator concentration in the layer 44, very limited penetration would occur into layer 42. In connection with FIG. 6, a plurality of capacitance devices such as 40 may be provided on the same substrate and also other active devices such as MOSFET transistors etc. may be included on the substrate.

While the invention has been described in terms of devices fabricated on an N-type substrate for storage and transfer of holes, it is equally possible to utilize a substrate of P-type conductivity for the storage and transfer of electrons, with the application of voltages of the reverse sign. In certain applications it may also be desirable to form a substrate containing regions of both N and P conductivity types.

While the invention has been described in connection with surface charge transfer devices, the invention is equally applicable to various bulk charge transfer devices such as described in patent application Ser. No. 375,752, filed July 2, 1973, now U.S. Pat. No. 3,902,187 and U.S. Pat. No. 3,792,322—Boyle and Smith in which a thin surface adjacent region of conductivity type opposite to the conductivity type of the substrate is provided. In such devices charge is stored in storage sites within the bulk of the thin surface adjacent region and shifted from bulk storage site to bulk storage site. By providing such a surface adjacent thin region of opposite conductivity in the first layer of FIG. 1, a bulk charge storage device results in which the equivalent oxide capacitance is the capacitance between the bulk storage site and the overlying conductor member and in which the semiconductor or substrate capacitance is the capacitance between the bulk storage site and the underlying layer of low resistivity corresponding to the second layer of FIG. 1. With potentials set and quantities of charge stored in the storage site at which depletion extends to the second layer, both the equivalent oxide capacitance and substrate depletion capacitance are maintained substantially constant to achieve the improvement in linearity of response of the device.

While the invention has been described principally in connection with the sensing of charge in the output circuits of charge transfer apparatus, the invention is equally applicable to the initiation or the introduction of packets of charge in charge transfer apparatus such as transversal filters, correlators and the like. Conventionally, a packet of charge is formed for introduction into a surface charge shift register by injecting charge from a source region of conductivity type opposite to the substrate through a surface channel underlying a gate electrode into a semiconductor storage region underlying a storage electrode and allowing the surface potential of the storage region to equilibrate with the potential of the source. Such a charge introduction structure is disclosed in connection with FIG. 1 of patent application Ser. No. 331,483, filed Feb. 12, 1973, now U.S. Pat. No. 4,032,948 and assigned to the assignee of the present invention. In such a charge input structure the charge introduced into the storage region is a non-linear function of the potential of the source as the surface potential of the storage region varies and the charge stored therein is a non-linear function of its surface potential. In such a charge input circuit provided with a storage region having the structure set forth in FIG. 1 the depletion capacitance would be substantially constant and packets of charge formed therein would be a linear function of the potential of the source.

While the invention has been described in specific embodiments it will be appreciated that modifications, such as those described above, may be made by those skilled in the art and it is intended by the appended claims to cover all such modifications and changes as fall within the true spirit and scope of the invention.

I claim as follows:

1. In combination, a substrate of one conductivity type semiconductor material having a first layer and a second layer, said first layer being of substantially uniform thickness and overlying said second layer, the resistivity of said first layer being substantially greater than the resistivity of said second layer, an insulator overlying said first layer, a conductor member overlying said insulator member, said second layer includes a first region of low resistivity and a second region of higher resistivity, said first region underlying said conductor member and substantially coextensive with said conductor member in a plane through said first region parallel to the plane of said conductor member, said first region being bounded within said plane by said second region, means for applying a voltage between said conductor member and said second layer to deplete entirely of majority carriers the portion of said first layer underlying said conductor member and to deplete at least a portion of said second layer underlying said conductor member, said first layer being sufficiently thick so that substantially all of the potential drop produced by said voltage in said layers appears across said first layer, means for introducing charge in the form of minority carriers corresponding to a signal into said portion of said first layer in a manner to cause the surface potential thereof to change in absolute magnitude while still maintaining depletion in at least a portion of said second layer whereby the change in surface potential of said depleted portion of said first layer is substantially linearly proportional to the charge introduced therein.

* * * * *